United States Patent
Seeber et al.

(10) Patent No.: US 10,126,386 B2
(45) Date of Patent: Nov. 13, 2018

(54) SYSTEMS AND METHODS FOR MRI CONTINUOUS GRADIENT COILS

(71) Applicant: General Electric Company, Schenectady, NY (US)

(72) Inventors: Derek Allan Seeber, Florence, SC (US); David Glenn Lee, Florence, SC (US); Eric George Budesheim, Niskayuna, NY (US); Timothy Elden Wise, Florence, SC (US); Jean-Baptiste Mathieu, Florence, SC (US); Charles Franklin Helms, Florence, SC (US); Michael Dominic Graziani, Niskayuna, NY (US); Sung Man Moon, Florence, SC (US); Justin Ricci, Niskayuna, NY (US); William Louis Einziger, Florence, SC (US); Anthony Mantone, Florence, SC (US); Hannah Leigh Aaronson, Durham, SC (US)

(73) Assignee: General Electric Company, Schenectady, NY (US)

( * ) Notice: Subject to any disclaimer, the term of this patent is extended or adjusted under 35 U.S.C. 154(b) by 608 days.

(21) Appl. No.: 14/755,187

(22) Filed: Jun. 30, 2015

(65) Prior Publication Data
US 2017/0003361 A1    Jan. 5, 2017

(51) Int. Cl.
  *G01R 33/385*    (2006.01)
(52) U.S. Cl.
  CPC ........ *G01R 33/385* (2013.01); *G01R 33/3858* (2013.01)

(58) Field of Classification Search
  CPC ............ G01R 33/3628; G01R 33/3621; G01R 33/3415; G01R 33/3852; G01R 33/141; G01R 33/385; G01R 33/3858
  See application file for complete search history.

(56) References Cited

U.S. PATENT DOCUMENTS

| | | | |
|---|---|---|---|
| 4,780,676 A | 10/1988 | Muller et al. | |
| 5,198,769 A * | 3/1993 | Frese | G01R 33/385 324/318 |
| 5,570,021 A | 10/1996 | Dachniwskyj et al. | |
| 6,011,394 A | 1/2000 | Petropoulos et al. | |
| 6,075,363 A | 6/2000 | Sellers et al. | |
| 6,111,412 A | 8/2000 | Boemmel et al. | |
| 6,208,141 B1 | 3/2001 | Amor, Sr. et al. | |
| 6,236,207 B1 | 5/2001 | Arz et al. | |

(Continued)

*Primary Examiner* — Jermele M Hollington
*Assistant Examiner* — Suresh K Rajaputra
(74) *Attorney, Agent, or Firm* — Dean D. Small; The Small Patent Law Group, LLC

(57) ABSTRACT

A magnetic resonance imaging (MRI) gradient coil assembly includes a substrate and first hollow conductor coil. The substrate has a surface. The first hollow conductor coil includes a first coiled portion and a first end run portion joined by a first eye lead portion. The first coiled portion defines a series of increasing radius loops disposed on the surface of the substrate, with an outer loop of the first coiled portion defining a coiled portion boundary. The first eye lead portion is disposed in a central portion of the first coiled portion. The first end run portion extends continuously from the first coiled portion via the first eye lead portion beyond the coiled portion boundary.

20 Claims, 7 Drawing Sheets

(56) References Cited

U.S. PATENT DOCUMENTS

| | | | |
|---|---|---|---|
| 6,552,545 B2 | 4/2003 | Kaindl et al. | |
| 2004/0227516 A1* | 11/2004 | Endt | G01R 33/385 |
| | | | 324/318 |
| 2005/0035764 A1* | 2/2005 | Mantone | G01R 33/3856 |
| | | | 324/318 |

* cited by examiner

SYSTEMS AND METHODS FOR MRI CONTINUOUS GRADIENT COILS

BACKGROUND OF THE INVENTION

Embodiments of the present disclosure generally relate to coils for use with magnetic resonance imaging (MRI) systems, for example, gradient coils formed from hollow tubular material.

MRI is a medical imaging modality that generates images of the inside of a human body without using x-rays or other ionizing radiation. MRI or Nuclear Magnetic Resonance (NMR) imaging generally provides for the spatial discrimination of resonant interactions between Radio Frequency (RF) waves and nuclei in a magnetic field. Typically, an MRI system includes a superconducting magnet that generates a main magnetic field within an imaging volume. The MRI system uses various types of radio frequency (RF) coils to create pulses of RF energy. The RF coils transmit RF excitation signals and receive magnetic resonance (MR) signals that the MRI system processes to form the images.

In some MRI systems, hollow tubes may be utilized to form coils, such as transverse gradient coils. Conventionally, braze joints are employed between the center of a transverse coil and the eye lead of a gradient. However, such braze joints may be difficult, expensive, and/or inconvenient to form and/or maintain, for example, due to difficulty of access of the center of a transverse coil. For example, conventional braze joints may require the use of a complicated coupling joint and brazing two hollow conductors and the joint together at the same time. The braze process may cause a blockage due to excessive braze material in the joint. As water (or other coolant) may flow through the hollow tubes for direct cooling, blockages or obstructions caused by braze material may impede fluid flow and provide decreased cooling. Further, insulation coating on the wire may be damaged or removed during a brazing process.

BRIEF DESCRIPTION OF THE INVENTION

In one embodiment, a magnetic resonance imaging (MRI) gradient coil assembly is provided that includes a substrate and first hollow conductor coil. The substrate has a surface. The first hollow conductor coil includes a first coiled portion and a first end run portion joined by a first eye lead portion. The first coiled portion defines a series of increasing radius loops disposed on the surface of the substrate, with an outer loop of the first coiled portion defining a coiled portion boundary. The first eye lead portion is disposed in a central portion of the first coiled portion. The first end run portion extends continuously from the first coiled portion via the first eye lead portion beyond the coiled portion boundary.

In another embodiment, a magnetic resonance imaging (MRI) gradient coil system is provided that includes a substrate, a first hollow conductor coil, and a manifold. The substrate has a surface. The first hollow conductor coil includes a first coiled portion and a first end run portion joined by a first eye lead portion. The first coiled portion defines a series of increasing radius loops disposed on the surface of the substrate, with an outer loop of the first coiled portion defining a coiled portion boundary. The first eye lead portion is disposed in a central portion of the first coiled portion. The first end run portion extends continuously from the first coiled portion via the first eye lead portion beyond the coiled portion boundary. The manifold is operably coupled to the first end run portion, and is configured to provide electrical current and a fluid supply to the first hollow conductor coil.

In another embodiment, a method (e.g., a method for forming a magnetic resonance imaging (MRI) gradient coil assembly) is provided. The method includes providing a substrate. The method also includes winding a first hollow conductor coil to define a first coiled portion having a series of increasing radius loops, and disposing the first hollow conductor coil on the surface of the substrate, with an outer loop of the first coiled portion defining a coiled portion boundary. Further, the method includes forming a first and run portion of the first hollow conductor coil that is continuously joined to the first coiled portion by a first eye lead portion, wherein the first end run portion extends continuously from the first coiled portion via the first eye lead portion beyond the coiled portion boundary.

DETAILED DESCRIPTION OF THE INVENTION

Figure 1:
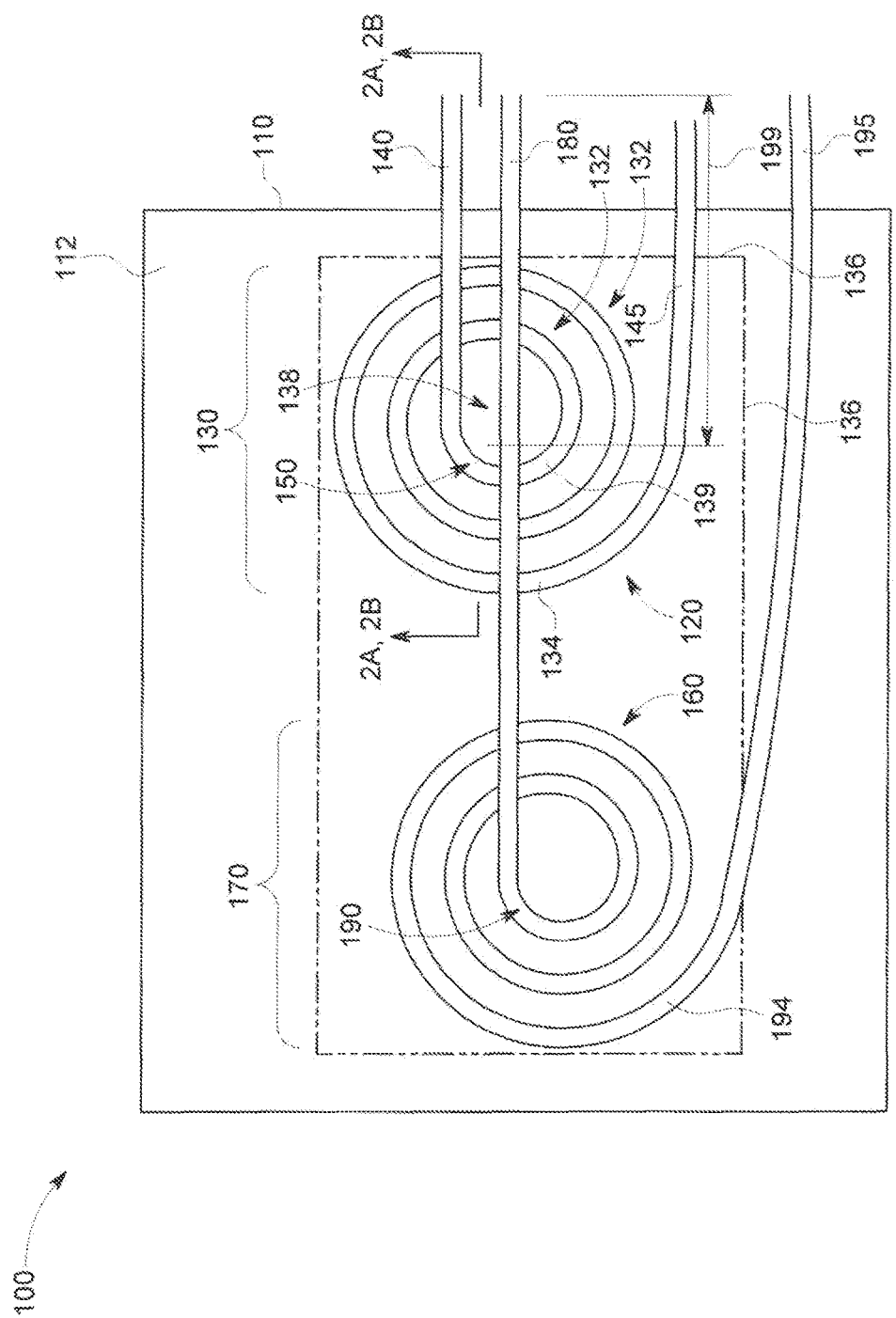
FIG. 1 illustrates a block schematic diagram of an MRI gradient coil system formed in accordance with various embodiments.

The following detailed description of certain embodiments will be better understood when read in conjunction with the appended drawings. To the extent that the figures illustrate diagrams of the functional blocks of various embodiments, the functional blocks are not necessarily indicative of the division between hardware circuitry. For example, one or more of the functional blocks (e.g., processors or memories) may be implemented in a single piece of hardware (e.g., a general purpose signal processor or a block of random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, the terms "system," "unit," or "module" may include a hardware and/or software system that operates to perform one or more functions. For example, a module, unit, or system may include a computer processor, controller, or other logic-based device that performs operations based on instructions stored on a tangible and non-transitory computer readable storage medium, such as a computer memory. Alternatively, a module, unit, or system may include a hard-wired device that performs operations based on hard-wired logic of the device. Various modules or units shown in the attached figures may represent the hardware that operates based on software or hardwired instructions, the software that directs hardware to perform the operations, or a combination thereof.

"Systems," "units," or "modules" may include or represent hardware and associated instructions (e.g., software stored on a tangible and non-transitory computer readable storage medium, such as a computer hard drive, ROM, RAM, or the like) that perform one or more operations described herein. The hardware may include electronic circuits that include and/or are connected to one or more logic-based devices, such as microprocessors, processors, controllers, or the like. These devices may be off-the-shelf devices that are appropriately programmed or instructed to perform operations described herein from the instructions described above. Additionally or alternatively, one or more of these devices may be hard-wired with logic circuits to perform these operations.

As used herein, an element or step recited in the singular and preceded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

Various embodiments provide transverse gradient coil assemblies including hollow tube portions that extend continuously from a coiled portion through an end run portion. Various embodiments provide coils in which a center eye lead portion is continuous with a transverse gradient winding, helping to eliminate failure modes associated with brazed joints and/or decreasing assembly time. For example, each center eye lead from a pair of PE and SE transverse gradient boards may be continuous and run to the service end of the gradient coil, and be brazed to a manifold or other junction at the service end. In various embodiments, a section of parallel runs from eye leads may have current running in opposite direction to cancel out fields generated by the two parallel runs. Braze joints formed at the service end of a gradient coil are easier to form and reduce damage to insulation coating in a critical location (e.g., proximate the center eye lead).

Various embodiments provide coil assemblies utilizing continuous lengths of tubing extending between a coiled portion and an end run. A technical effect of at least one embodiment includes improving performance of MRI systems, for example due to reduction or elimination of failure modes associated with brazed joints at eye leads of transverse gradient coils. A technical effect of at least one embodiment includes reduced assembly time and/or cost. A technical effect of at least one embodiment includes reduced maintenance time and/or cost (e.g., due to more easily accessible braze joints located at a service end of gradient coil assembly). A technical effect of at least one embodiment includes reduction in undesired fields (e.g., fields resulting from oppositely directed current from parallel runs leading from eye leads may cancel each other out over at least a portion of the runs).

Figure 2A:
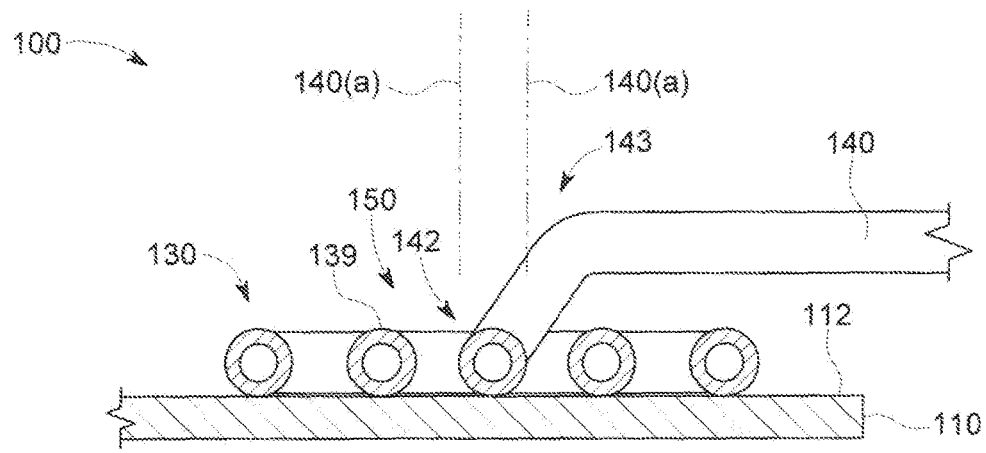
FIG. 2A illustrates a side sectional view taken along line 2A-2A of FIG. 1 in accordance with various embodiments.
Figure 2B:
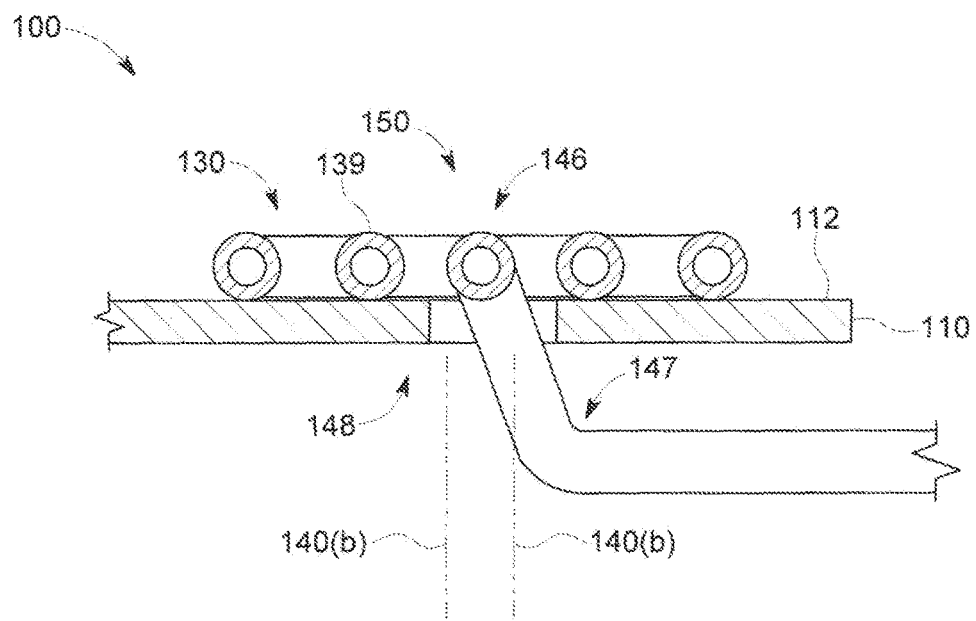
FIG. 2B illustrates a side sectional view taken along line 2B-2B of FIG. 1 in accordance with various embodiments FIG. 3 provides an end view of a gradient coil system formed in accordance with various embodiments.

FIG. 1 illustrates a block schematic diagram of a plan view of an MRI gradient coil assembly 100, and FIGS. 2A and 2B provide side sectional views of embodiments of the gradient coil assembly 100. The gradient coil assembly 100 of the illustrated embodiment may be utilized as a transverse gradient coil assembly (e.g., an x-transverse gradient coil assembly or a y-transverse gradient coil assembly, where the z-axis is defined along an axis of a cylinder at least partially defined by the gradient coil assembly 100). The depicted gradient coil assembly 100 includes a substrate 110, a first hollow conductor coil 120, and a second hollow conductor coil 160. The first hollow conductor coil 120 and second hollow conductor coil 160 are disposed on the substrate 110, which provides support to the hollow conductor coils and maintains the hollow conductor coils in a desired position and shape (e.g., a circular shape about a bore in which an object to be imaged is disposed). The hollow conductor coils are made of an electrically conductive material (e.g., copper) and are supplied with an electrical current to produce a gradient magnetic field for use in MRI. The hollow conductor coils may be formed of tubes, for example, cylindrical tubes, rectangular tubes, or square tubes (or tubes having cylindrical, rectangular, or square cross sections). For example, a given hollow conductor coil may be formed by bending or otherwise forming at least a portion of a length of rectangular tube. The current provided may be relatively large to provide the desired strength field. For example, the current may be on the order of 1000 amps. Such a current may cause heating of the hollow conductor coils. Accordingly, the first hollow conductor coil 120 and the second hollow conductor coil 160 may be provided with a coolant (e.g., do-ionized water) that is circulated through the hollow conductor coils. For ease and clarity of illustration, the illustrated embodiment is schematically depicted in FIG. 1 as a plan view of a flat surface; however, in practice the coil assembly 100 may have a curved surface. For example, the substrate 110 may be formed as a half-cylinder, with the gradient coil assembly 100 also including an additional half-cylinder substrate with one or more additional coils disposed thereon, with the half-cylinder substrates cooperating to form a cylinder into which a body coil may be positioned. Further, it may be noted that, for ease and clarity of illustration, both hollow conductor coils of the embodiment in FIG. 1 are depicted as winding in a clockwise direction; however, in practice one coil may wind in a clockwise direction and one coil may wind in a counter-clockwise direction, for example, to provide an appropriate field.

As seen in FIG. 1, the depicted substrate 110 has a surface 112. Generally, the substrate is shaped to define at least a portion of an imaging volume. Additional coils (e.g., body coils, transmit coils) may be disposed within the imaging volume along with an object to be imaged. In some embodiments, the substrate 110 may be interposed between the hollow conductor coils and the imaging volume. The substrate 110 supports the hollow conductor coils in a desired orientation and/or position with respect to the imaging volume and/or other coils of an MRI system. The substrate may be made of a flexible material, for example, a polyester laminate or any other malleable or flexible non-conductive material, such as a thin fiberglass substrate. In some embodiments, all or a portion of the hollow conductor coils may be formed into a desired shape or pattern (e.g., a series of increasing radius loops) and then affixed to the substrate 110 (e.g., using epoxy). It may be noted that a single, one-piece substrate is depicted in FIG. 1. In various embodiments, the substrate may be formed from separate pieces. Also, the substrate, as discussed herein, may include cutouts or other openings to allow for a portion (e.g., an end run portion and/or a return run portion) of a hollow conductor coil to pass beneath the substrate (or on the opposite side of the substrate from the coiled portion of the hollow conductor coil. Further, it may be noted that the substrate may include alignment holes or other alignment features to help align two or more coils or portions thereof that are disposed on the substrate.

Figure 3:
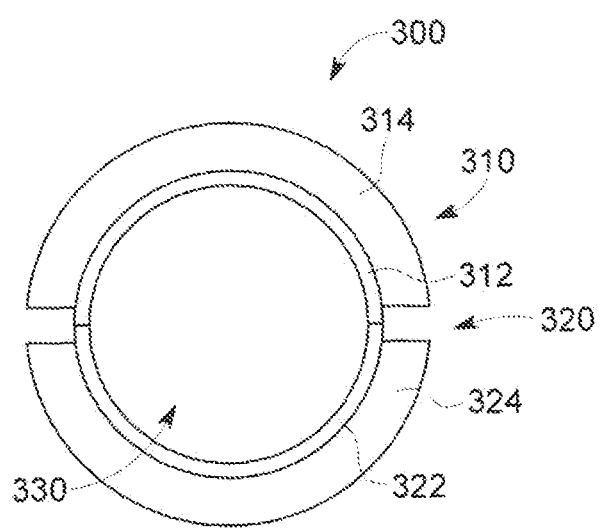

As mentioned herein, the substrate 110 may be bent or otherwise formed to define a shape that cooperates with additional substrates to define an imaging volume. For example, the substrate 110 may be bent to form a half-cylinder or other portion of a cylinder. FIG. 3 provides an end view of a gradient coil system 300 formed in accordance with various embodiments. As seen in FIG. 3, the gradient coil system 300 includes a first half-cylinder 310 that includes a first substrate 312 with coils 314 disposed thereon, and a second half-cylinder 320 that includes a second substrate 322 with coils 324 disposed thereon. The substrates and coils may be generally similar to the substrates and coils discussed in connection with FIG. 1. For example, each substrate may have one or more coils that are wound in a flat or planar state and affixed to the substrate, with the substrate than pinch-rolled or otherwise formed into a half-cylinder. The two half-cylinders may then be joined to define a bore 330 into which, for example, a body coil may be disposed to define an imaging volume.

With continued reference to FIG. 1, the first hollow conductor coil 120 includes a first coiled portion 130 and a first end run portion 140 joined by a first eye lead portion 150. The first hollow conductor coil 120 may be formed from an electrically conducting material (e.g., copper), with at least a portion of the exterior of the first hollow conductor coil 120 covered with enamel or other covering configured to provide improved adhesion with the substrate 110. As seen in FIG. 1, the first coiled portion 130 defines a series of increasing radius loops 132 disposed on the surface of the substrate 110. It may be noted that only a few loops 132 are shown in FIG. 1 for ease and clarity of illustration; however, in practice more loops 132 may be employed. Further, the loops 132 may be differently shaped as well. An outer loop 134 helps define a coiled portion boundary 136. For example, the coiled portion boundary 136 may be defined by the outermost loop of any hollow conductor coil disposed on the substrate. As another example, an envelope or footprint defined by the substrate 110 may define the coiled portion boundary 136 in some embodiments. As seen in FIG. 1, the first eye lead portion 150 is disposed in a central portion 138 of the first coiled portion 130. The central portion 138 in the illustrated embodiment is disposed within an inner loop 139.

As also seen in FIG. 1, the depicted first and run portion 140 extends from the first eye lead portion 150 beyond the coiled portion boundary 136. It may be noted that the first end run portion 140, the first eye lead portion 150, and the first coiled portion 130 of the illustrated embodiment define a continuous structure, or are all formed (e.g., bent) from a continuous length 121 of the first hollow conductor coil 120. A continuous length of a structure or hollow conductor coil may be understood as a length that is formed from a single structure or hollow conductor coil, which is absent any joined pieces (e.g., pieces joined by welding, brazing, threaded portions, fittings, or the like). The depicted gradient coil assembly 100 therefore removes the need for brazing or otherwise attaching an end run portion to a coiled portion via a separate eye lead portion, saving the time, inconvenience, and expense of brazing or other joining applications.

Generally, the first coiled portion 130 is formed into a coiled shape configured to provide a desired transverse gradient field (e.g., a field transverse to a central axis of an imaging volume, such as the z-axis of a bore of an MRI system). The first end run portion 140 is configured to connect to a fluid supply and electrical current supply at a location outside of the coiled portion boundary 136 and/or outside of an imaging volume or bore of an MRI system. The first end run portion 140, for example, may be connected to a manifold or fitting via a brazing process; however, it may be noted that such a brazing process outside of the coiled portion boundary or imaging volume is more easily, conveniently, and inexpensively accomplished than a brazing performed proximate the central portion 138 of the first coiled portion 130. It is also possible to connect the end run portion 140 to a manifold mechanically without brazing. In this case separate electrical connections to the end run portion may be made. An electrical current (to provide a desired field from the gradient coil) as well as a fluid supply (for cooling) may be passed through the first coiled portion 130 via the first end run portion 140. It may be noted that the current to the first and second hollow conductor coils may be provided in series, while fluid to the first and second hollow conductor coils may be provided in parallel via the manifold.

The depicted first hollow conductor coil 120 includes a first return run portion 145. In the illustrated embodiment, the first return run portion 145 extends continuously from the outer loop 134 of the first coiled portion 130. The first return run portion 145, similar to the first end run portion 140, may be fluidly and electrically coupled to a manifold or other junction member to provide for the circulation of electrical current and a cooling fluid flow through the first hollow conductor coil 120.

It may be noted that in some embodiments, at least a portion of the first end run portion 140 may be disposed above the surface 112 of the substrate 110. As used herein "above" the surface 112 of the substrate 110 does not necessarily mean at a higher elevation. Rather, the first and run portion 140 may be understood as being above the substrate 110 when at least a portion of the first coiled portion 130 (which is afixed to the substrate 110 after assembly) is interposed between at least a portion of the first end run portion 140 and the surface 112 of the substrate 110. An example sectional view of first end portion 140 dispose above a substrate 110 is shown in FIG. 2A.

As seen in FIG. 2A, the first end run portion 140 is bent at first bend 142 in a direction at least partially oriented away from the substrate 110 as the first end run portion extends from the first eye lead portion 150 disposed within the inner loop 139. The first end run portion 140 is then bent at second bend 143 to be oriented parallel to the substrate 110 as the first end run portion 140 extends past a boundary corresponding to the first coiled portion 130. To form the first hollow conductor coil 120 as shown in FIG. 2A, the loops of the first coiled portion may be first be formed, with the first end run portion extending at either a normal or oblique angle to a plane defined by the loops of the first coiled portion 130. The substrate 110 may then be affixed to the first coiled portion 130 (e.g., via epoxy). The surface 112 of the substrate 110 may be affixed to the side of the first coiled portion 130 that is opposite to the side from which the first end run portion 140 extends (e.g., in the illustrated embodiment, the first end run portion 140 may extend along phantom lines 140a). With the first coiled portion 130 affixed to the substrate 110, the first end run portion 140 may be bent at the first bend 142 and the second bend 143 to provide a desired elevation and orientation for the first end run portion 140. It may be noted that the depicted arrangement is provided by way of example for illustrative purposes. Other numbers, shapes, and/or types of bends may be employed in various embodiments. It may be noted that the bends in various embodiments are generally smooth and are not right angle bends.

It may be noted that in some embodiments, alternatively or additionally, at least a portion of an end run portion may be disposed below the surface of a substrate. For example, an MRI system may have some substrates with end run portions disposed above the substrate and some substrates with end run portions disposed below the substrate. As used herein, "below" the surface 112 of the substrate 110 does not necessarily mean at a lower elevation. Rather, the first end run portion 140 may be understood as being below the substrate 110 when at least a portion of the surface 112 of the substrate is interposed between at least a portion of the first end run portion and at least a portion of the first coiled portion 130 (which is affixed to the substrate 110 after assembly). An example sectional view of first end portion 140 dispose below a substrate 110 is shown in FIG. 2B.

As seen in FIG. 2B, the first end run portion 140 is bent at first bend 146 in a direction oriented through an opening 148 of the substrate 110 as the first end run portion 140 extends from the first eye lead portion 150 disposed within the inner loop 139. The first end run portion 140 is then bent at second bend 147 to be oriented parallel to the substrate 110 as the first end run portion 140 extends past a boundary defined by the first coiled portion 130. To form the first hollow conductor coil 120 as shown in FIG. 2A, the loops of the first coiled portion 130 may be first be formed, with the first end run portion extending at either a normal or oblique angle to a plane defined by the loops of the first coiled portion 130. The substrate 110 may then be affixed to the first coiled portion 130 (e.g., via epoxy), with the first end run portion oriented along phantom lines 140b and extending through the opening 148). With the first coiled portion 130 affixed to the substrate 110, the first end run portion 140 may be bent at the first bend 146 and the second bend 147 to provide a desired elevation and orientation for the first end run portion 140. It may be noted that an additional opening may be provided in the substrate 110 and the first return run portion 145 may, generally similar to the first end run portion 140, pass through an opening in the substrate 110 and be disposed below the substrate 110. It may further be noted that the depicted arrangement is provided by way of example for illustrative purposes. Other numbers, shapes, and/or types of bends may be employed in various embodiments.

With continued reference to FIG. 1, the depicted gradient coil assembly 100 includes a second hollow conductor coil 160 disposed on the surface 110 of the substrate 112. The second hollow conductor coil 160 may be generally similar to the first hollow conductor coil 120 in various respects. For example, the second hollow conductor coil 160 may be formed from an electrically conductive material (e.g., copper) and at least partially covered with a lacquer or enamel for improved adhesion to the substrate 110 (e.g., via an epoxy). As seen in FIG. 1, the second hollow conductor coil 160 includes a second coiled portion 170 and a second end run portion 180 that are continuously joined by a second eye lead portion 190. The second end run portion 180 is oriented parallel to the first end run portion 140, and extends past the coiled portion boundary. Generally similar to the first end run portion 140, the second end run portion 180 is configured to connect to a fluid supply and electrical current supply at a location outside of the coiled portion boundary 136 and/or outside of an imaging volume or bore of an MRI system. An electrical current (to provide a desired field from the gradient coil) as well as a fluid supply (for cooling) may be passed through the second coiled portion 170 via the second end run portion 180. It may be noted that the current passing through the second end run portion 180 (and the second hollow conductor coil 160) may be oriented in an opposite direction to the current passing through the first end run portion 140 (and the first hollow conductor coil 120). Accordingly, fields generated by the current in the first end run portion 140 and the second end run portion 180 may act to cancel each other out over region 199 in which the first end run portion 140 and the second end run portion 180 pass parallel to each other.

The depicted second hollow conductor coil 160 includes a second return run portion 195. The second return run portion 195 may be generally similar to the first return run portion 145 of the first hollow conductor coil 120 in various respects. For example, in the illustrated embodiment, the second return run portion 195 extends continuously from an outer loop 194 of the second coiled portion 170. The second return run portion 195 may be fluidly and electrically coupled to a manifold or other junction member to provide for the circulation of electrical current and a cooling fluid flow through the second hollow conductor coil 160.

Figure 4:
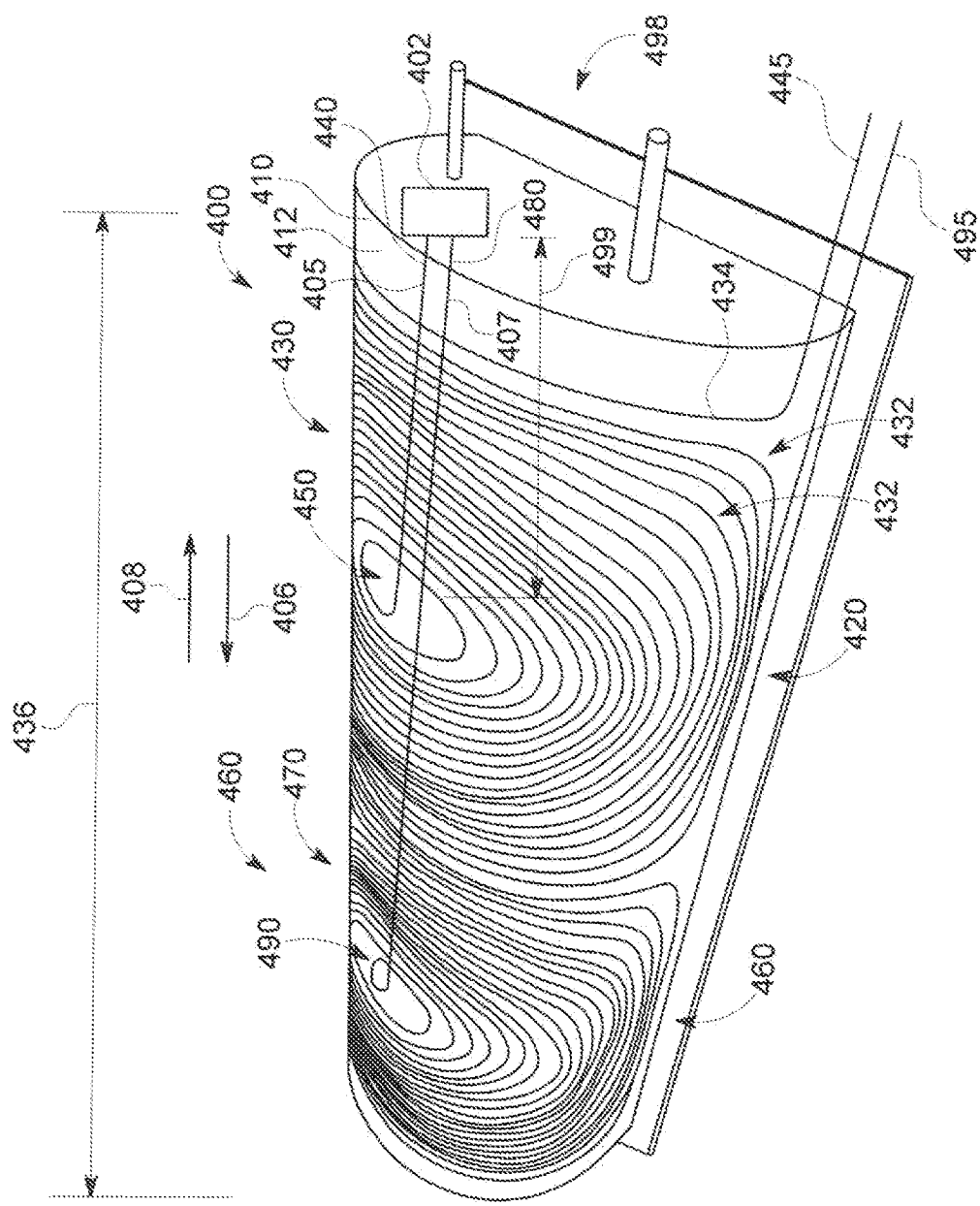
FIG. 4 illustrates a perspective schematic view of a gradient coil assembly in accordance with various embodiments.

FIG. 4 provides a schematic perspective view of a gradient coil system 400 formed in accordance with various embodiments. The gradient coil system 400 may be generally similar to the gradient coil assembly 100 in various respects. As seen in FIG. 4, the gradient coil system 400 includes a substrate 410, a first hollow conductor coil 420, a second hollow conductor coil 460, and a manifold 402. Generally, the manifold may be used to provide electrical current and a cooling fluid supply to the first hollow conductor coil 420 and the second hollow conductor coil 460. It may be noted that additional gradient coil and substrate assemblies may be provided as part of an MRI system. For example, an additional half-cylinder coil and substrate assembly may be combined with the depicted gradient coil system 400 to form a first gradient coil (e.g., an x-gradient coil). Further, two additional half-cylinders having a different diameter than the depicted gradient coils system 400 may be combined to form a second gradient coil (e.g., a y-gradient coil), with the x-gradient coil and the y-gradient coil positioned concentrically about a bore of the MRI system.

The substrate 410 has a surface 412. As seen in FIG. 4, the depicted substrate is bent to define a half-cylinder shape. The hollow conductor coils are affixed to the surface 412 of the substrate 410. For example, the hollow conductor coils may be adhered to the surface 412 using an epoxy. In some embodiment, the hollow conductor coils may be flat wound or wound in a generally planar configuration and affixed to a flat or planar substrate, with the substrate pinch-roller or otherwise bent or formed to a desired shape (e.g., half-cylindrical).

The hollow conductor coils may be generally similar in various respects to the hollow conductor coils discussed in connection with FIGS. 1, 2A, and 2B. For example, the first hollow conductor coil 420 includes a first coiled portion 430 and a first end run portion 440 joined by a first eye lead portion 450. The first coiled portion 430, first end run portion 440, and first eye lead portion 450 are formed from a continuous length of hollow tubing in the illustrated embodiment, removing the expense and inconvenience of brazed or otherwise joined tubing sections proximate an eye lead portion. As seen in FIG. 4, the first coiled portion 430 defines a series of increasing radius loops 432 disposed on the surface of the substrate 410. An outer loop 434 helps define a coiled portion boundary 436. For example, the coiled portion boundary 436 may be defined by the outermost loop of any hollow conductor coil disposed on the substrate 410. As another example, an envelope or footprint defined by the substrate 410 may define the coiled portion boundary 436 in some embodiments.

As also seen in FIG. 4, the depicted first and run portion 440 extends from the first eye lead portion 450 beyond the coiled portion boundary 436. It may be noted that, generally similar to the embodiment discussed in connection with FIG. 1, the first end run portion 440, the first eye lead portion 450, and the first coiled portion 430 of the illustrated embodiment define a continuous structure, or are all formed (e.g, bent) from a continuous length of the first hollow conductor coil 420. Generally, the first coiled portion 430 is formed into a coiled shape configured to provide a desired transverse gradient field, and the first end run portion 440 is configured to connect to a fluid supply and electrical current supply at a location outside of the coiled portion boundary 436 and/or outside of an imaging volume or bore of an MRI system. The first end run portion 140, for example, may be connected to the manifold 402 or other junction element via a brazing process. Again, it may be noted that such a brazing process performed on a straight portion of tubing outside of the coiled portion boundary or imaging volume is more easily, conveniently, and inexpensively accomplished than a brazing performed proximate the coiled portion of a tube. An electrical current (to provide a desired field from the gradient coil) as well as a fluid supply (for cooling) may be passed through the first coiled portion 430 via the first end run portion 440 and the manifold. The manifold may be understood as being located on the service end 498 of an MRI system, with the service end 498 disposed on an opposite end than an end in which a patient or other object to be imaged is introduced into the bore of an MRI system. Also, the depicted first hollow conductor coil 420 includes a first return run portion 445, which may be generally similar in various respects to the first return run portion 145.

The second hollow conductor coil 460 may be generally similar in various respects to the second hollow conductor coil 160 discussed in connection with FIG. 1. For example, in the illustrated embodiment, the second hollow conductor coil 460 is disposed on the substrate 410. As seen in FIG. 4, the second hollow conductor coil 460 includes a second coiled portion 470 and a second end run portion 480 that are continuously joined by a second eye lead portion 490. The second end run portion 480 is oriented parallel to the first end run portion 440, and extends past the coiled portion boundary 436. Generally similar to the first end run portion 440, the second end run portion 480 is configured to connect to a fluid supply and electrical current supply via the manifold 402. It may be noted that in the illustrated embodiment, the second hollow conductor coil 460 is separately connected to the manifold 402 and is independently supplied with fluid. Thus, the cooling fluid used to cool the first hollow conductor coil 420 and the second hollow conductor coil 460 may be routed independently of each other. An electrical current (to provide a desired field from the gradient coil) as well as a fluid supply (for cooling) may be passed through the second coiled portion 470 via the second end run portion 480. It may be noted that in the illustrated embodiment, the second hollow conductor coil 460 includes a coiled portion and an end run portion continuously joined by an eye lead portion. However, in some embodiments, the first hollow conductor coil 420 may have the continuous arrangement discussed in connection with FIG. 4, while the second hollow conductor coil 460 may not have a continuous eye lead portion, but may instead have a brazed eye lead portion.

The depicted second hollow conductor coil 460 also includes a second return run portion 495 that may be generally similar to the first return runm portion 445 of the first hollow conductor coil 420 in various respects. The second return run portion 495 in the illustrated embodiment may be fluidly and electrically coupled to a manifold to provide for the circulation of electrical current and a cooling fluid flow through the second hollow conductor coil 460.

As discussed herein, the manifold 402 is operably coupled to the first hollow conductor coil 420 and the second hollow conductor coil 460. The manifold 402 is configured to provide electrical current and a fluid supply to the first hollow conductor coil 420 and the second hollow conductor coil 460. For example, the first hollow conductor coil 420 and the second hollow conductor coil 460 may be brazed or otherwise joined to the manifold 402 such that electrical current may pass from conductive portions of the manifold 402 to a conductive material (e.g., copper) defining the walls of the hollow conductor coils. The connections to the various hollow conductor coils may be insulated from each other so that separate currents may be supplied to each hollow conductor coil. Further, an inlet from (or outlet to) one or more external fluid supplies may be provided to the hollow conductor coils at the manifold 402 to allow circulation of cooling fluid through the hollow conductor coils.

It may be noted that the first end run portion 440 in the illustrated embodiment is configured to be supplied with a first current 405 from the manifold 402 passing in a first direction 406. Also, the second end run portion 480 is configured to be supplied with a second current 407 passing in a second direction 408. For example, the end run portions may be coupled to separate electrically conducting members of the manifold 402, with the electrically conducting members of the manifold insulated from each other. The second direction 408 is oriented opposite the first direction 406. Accordingly, fields generated by the first current 405 in the first end run portion 440 and by the second current 407 in the second end run portion 480 may act to cancel each other out over region 499 in which the first end run portion 440 and the second end run portion 480 pass parallel to each other.

Figure 5:
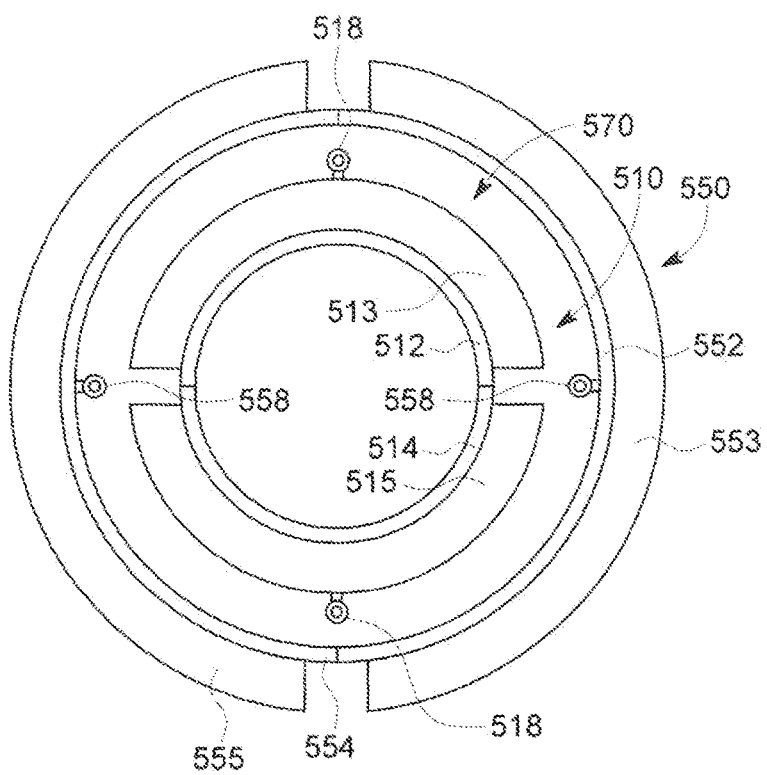
FIG. 5 illustrates an end view of gradient coil assembly formed in accordance with various embodiments.

In the embodiment illustrated in FIG. 4, the substrate 410 with the first and second hollow conductor coils mounted thereon defines a half-cylinder. In various embodiments, an additional substrate in a half-cylinder shape generally similarly configured to the substrate 410 (e.g., with corresponding third and fourth hollow conductor coils disposed thereon that are generally similar to the first and second hollow conductor coils) may be utilized with the substrate 410 to define a cylindrical gradient coil assembly providing a field in a first transverse direction. Further still, two additional half-cylinder substrate/hollow conductor coils may be utilized to form an additional gradient coil assembly providing a field in an additional transverse direction. FIG. 5 illustrates an end view of gradient coil system 500 including two cylindrical transverse gradient coils each formed from cooperating half-cylinder substrate/hollow conductor coil assemblies.

As seen in FIG. 5, the gradient coil assembly 500 includes a first transverse gradient coil assembly 510 and a second transverse gradient coil assembly 550. The first transverse gradient coil assembly 510 includes a first substrate 512 (e.g., formed generally similarly to the substrate 410) and a second substrate 514. The first substrate 512 includes a hollow conductor coil assembly 513 affixed thereto (e.g., formed generally similarly to the first hollow conductor coil 420 and/or the second hollow conductor coil 460), and the second substrate 514 includes a hollow conductor coil assembly 515 affixed thereto. The first substrate 512 and the second substrate 514 are generally half-cylindrically shaped and cooperate to form the first transverse gradient coil assembly 510, which is generally cylindrically shaped.

The second transverse gradient coil assembly 550 includes a third substrate 552 and a fourth substrate 554. The third substrate 552 includes a hollow conductor coil assembly 553 affixed thereto, and the fourth substrate 554 includes a hollow conductor coil assembly 555 affixed thereto. The third substrate 552 and the fourth substrate 554 are generally half-cylindrically shaped and cooperate to form the second transverse gradient coil assembly 550, which is generally cylindrically shaped.

As seen in FIG. 5, the diameter of the second transverse gradient coil assembly 550 is larger than the diameter of the first transverse gradient coil assembly 510, forming a gap 570 between the second transverse gradient coil assembly 550 and the first transverse gradient coil assembly 510. In the illustrated embodiment, end run portions 518 of the first transverse gradient coil assembly 510 are disposed within the gap 570, as are end run portions 558 of the second transverse gradient coil assembly 550. For example, the end run portions of the second transverse gradient coil assembly 550 may be disposed below the third and fourth substrates (see, e.g., FIG. 2B and related discussion), while the end run portions of the first transverse gradient coil assembly 510 may be disposed above the first and second substrates (see, e.g., FIG. 2A and related discussion). By disposing the end run portions of both the first transverse gradient coil assembly 510 and the second transverse gradient coil assembly 550 within the gap, radial space within a cylindrical MRI system may be conserved. In the illustrated embodiment, the first transverse gradient coil assembly 510 and the second transverse gradient coil assembly 550 are rotated 90 degrees with respect to each other (e.g., the coils of the assemblies are rotated 90 degrees with respect to each other, or the positions defined by the joining of the half-cylinder substrates are rotated 90 degrees with respect to each other).

Figure 6:
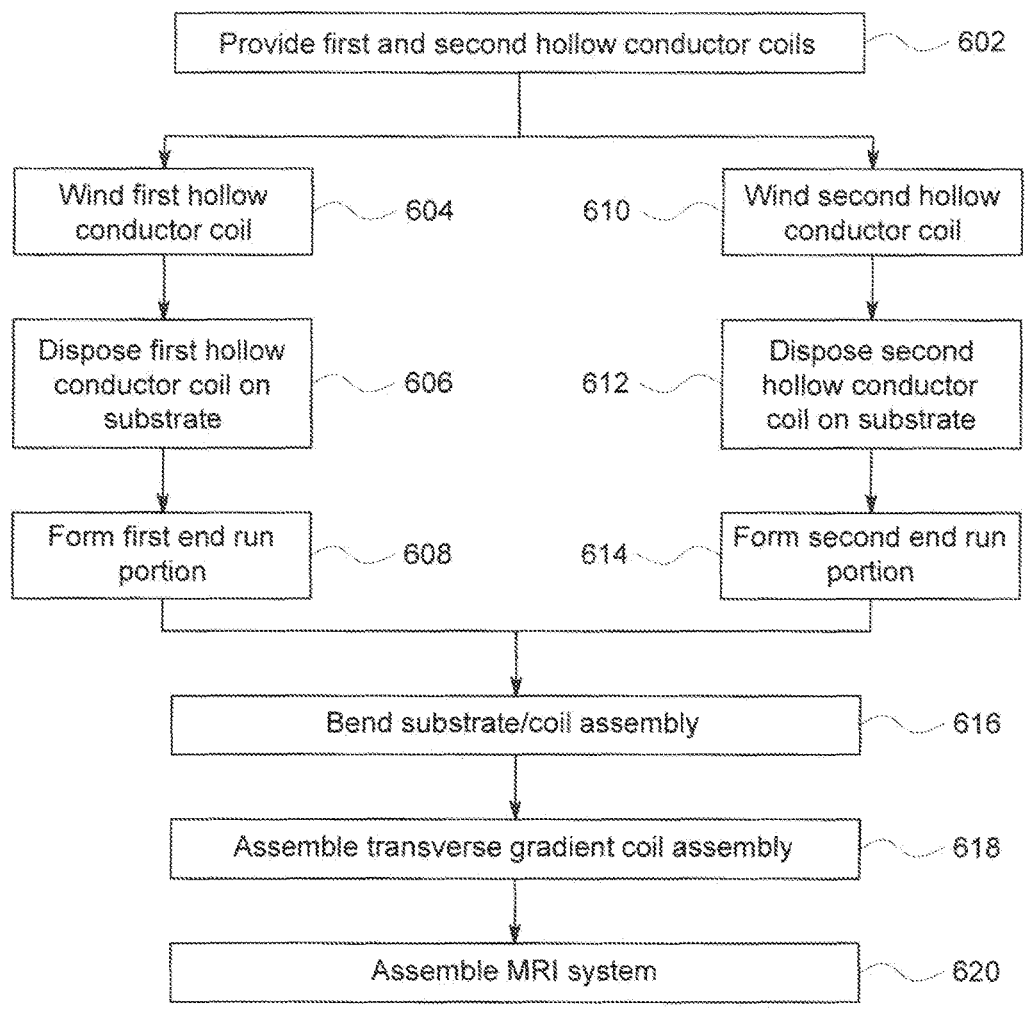
FIG. 6 is a flowchart of a method in accordance with various embodiments.

FIG. 6 provides a flowchart of a method 600 for providing a transverse gradient coil assembly. The method 600, for example, may employ or be performed by structures or aspects of various embodiments (e.g., systems and/or methods and/or process flows) discussed herein. In various embodiments, certain steps may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion. For example, the order of forming end runs and winding coils may be reversed for one or more hollow conductor coils.

At 602, first a second hollow conductor coils are provided. The hollow conductor coils, for example, may have a tubular structure and be made of a metal such as copper. It may be noted that in the depicted embodiment, two hollow conductor coils are placed on a single substrate. In other embodiments, other numbers of hollow conductor coils (e.g., only one) may be placed on a single substrate.

At 604, a first hollow conductor coil is wound. For example, a portion of a continuous length of a tube formed from a conductive material (e.g., copper) may be wound into a predetermined pattern of increasing radius loops. The winding may be performed to provide a generally flat or planar wound portion to be affixed to a generally flat or planar substrate (which may be bent to a desired shape subsequently). A straight or otherwise unwound portion of the hollow conductor coil may be left extending frmm a central portion of an inner loop of the wound portion (see, e.g., phantom lined portions of FIGS. 2A and 2B).

At 606, the first hollow conductor coil is disposed on a substrate. The substrate for example, may be generally similar to the substrates 110, 410 discussed herein. Generally, the substrate is configured to provide support to hollow conductor coils that are configured to provide at least a portion of a transverse gradient field for use with an MRI system. The first hollow conductor coil may be affixed to the substrate using epoxy, for example. In some embodiments, the wound portion of the first hollow conductor coil may be covered with a lacquer or enamel for improved adhesion with the substrate via the epoxy. For example, the first hollow conductor coil may be disposed at a desire positioning on the substrate with an epoxy applied, and the resulting assembly may be cured.

At 608, a first end run portion is formed. For example, a portion extending from a central portion of the wound portion may be bent to form the first end run portion. The first end run portion may extend beyond a boundary defined by a wound portion of the first hollow conductor coil (and/or other hollow conductor coil disposed on the substrate). The first end run portion may be formed above the substrate (see, e.g., FIG. 2A and related discussion), or may be formed below the substrate (see, e.g., FIG. 2B and related discussion). It may be noted that one or more additional hollow conductor coils may also be formed and added to the substrate. For example, in the illustrated embodiment, a second hollow conductor coil is formed and affixed or otherwise mounted to the substrate. It may be noted that in some embodiments, one or more end run portions may be formed before one or more corresponding hollow conductor coils are placed on and affixed to the substrate.

As depicted in FIG. 6, at 610, a second hollow conductor coil is wound (e.g., in a planar group of increasing radius loops). At 612, the second hollow conductor coil is disposed on the substrate. For example, the second hollow conductor coil may be disposed on the substrate on or about the same time as the first hollow conductor coil, with epoxy joining the first and second hollow conductor coils to the substrate, and the entire assembly cured. At 614, a second and run portion is formed, for example, by bending a portion of hollow tube continuously extending from a central portion of the loops of the wound portion of the second hollow conductor coil. It may further be noted that, in various embodiments, a return run portion may be formed for one or both of the first and second hollow conductor coils, with return run portion extending continuously from an outer loop of a wound portion.

At 616, the substrate/coil assembly (e.g., the substrate with one or more hollow conductor coils affixed thereto) is bent to a desired shape. For example, the substrate/coil assembly may be pinch-rolled or otherwise bent or formed to form a half-cylinder. At 618, in the illustrated embodiment, a transverse gradient coil assembly is assembled. For example, two half-cylinder shaped substrate/coil assemblies may be utilized to provide a cylindrically shaped coil assembly. It may be noted that the cylinder may be formed without joining the two half-cylinder substrate/coil assemblies.

At 620, an MRI system is assembled. The MRI system may have various components or aspects as generally appreciated by one skilled in the art. For example, FIG. 7 and the related discussion provide an example of an MRI system. In assembling the MRI system, one or more transverse gradient coils may be disposed about a bore of the MRI system configured to accept an object to be imaged. For example, a first cylindrical transverse gradient coil assembly may be concentrically disposed within a second cylindrical transverse gradient coil assembly (see, e.g., FIG. 5 and related discussion). The transverse gradient coil assemblies may be disposed radially inward of, for example, a superconducting main magnet. A body coil and/or transmit coils may be disposed radially inward of the transverse gradient coil assemblies in various embodiments. In various embodiments, the end run portions (and return run portions) of the hollow conductor coils may be operable coupled to a manifold disposed at a service end of the MRI system to provide current and a cooling fluid supply to the hollow conductor coils. Accordingly, the connections between the coils and the manifold may be conveniently achieved outside of an imaging volume of the MRI system for improved ease and cost of assembly and maintenance.

Figure 7:
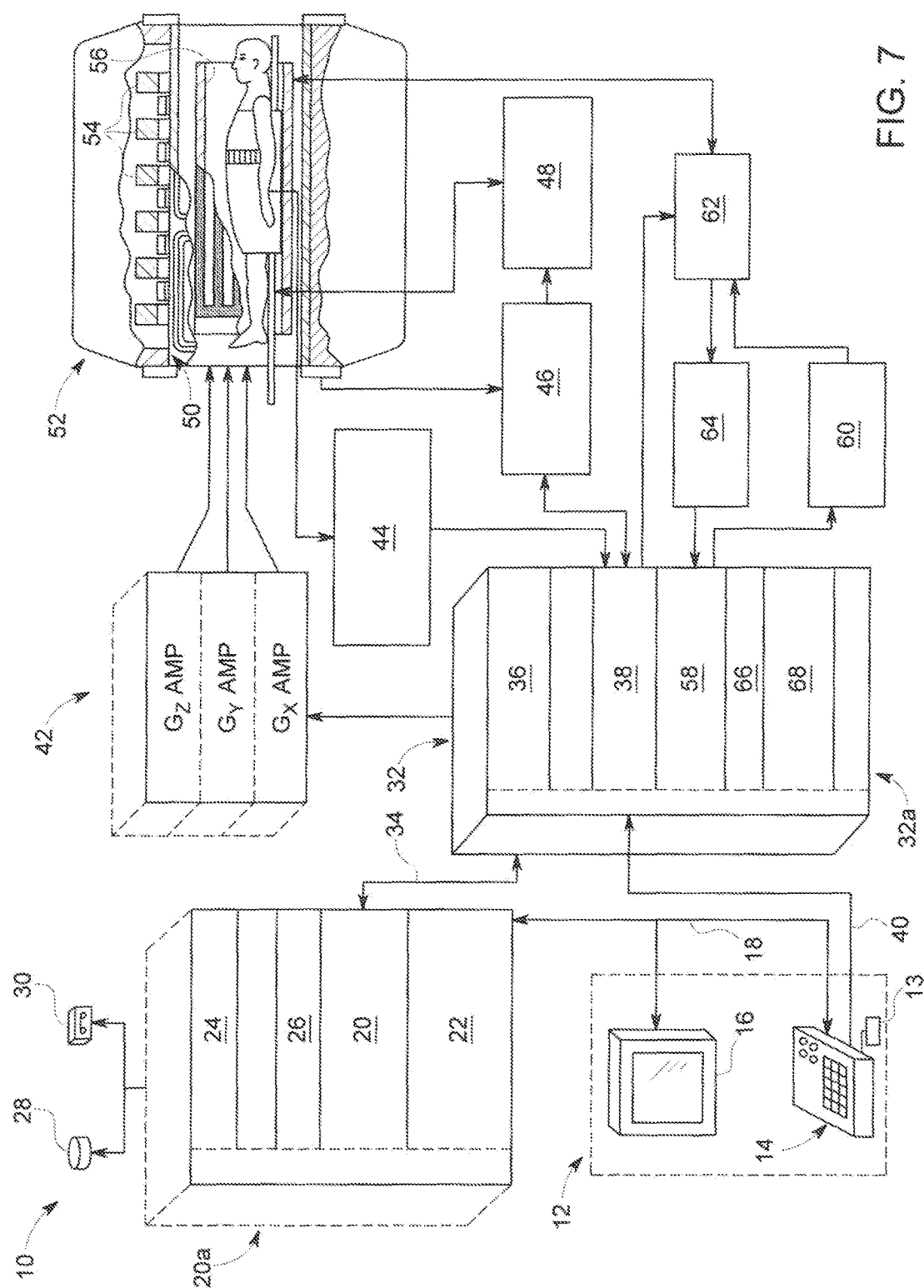
FIG. 7 illustrates a block schematic diagram of an MR system formed in accordance with various embodiments.

Various methods and/or systems (and/or aspects thereof) described herein may be implemented using a medical imaging system. For example, FIG. 7 depicts various major components of a MRI system 10 formed in accordance with various embodiments. The operation of the system is controlled from an operator console 12 which includes a keyboard or other input device 13, a control panel 14, and a display 16. The console 12 communicated through a link 18 with a separate computer system 20 that enables an operator to control the production and display of images on the screen 16. The computer system 20 includes a number of modules which communicate with each other through a backplane 20*a*. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light want, voice control, or any similar or equivalent input device, and may be used for interactive geometry prescription.

The system control 32 includes a set of modules connected together by a backplane 32*a*. These include a CPU module 36 and a pulse generator module 38 which connects to the operator console 12 through a serial link 40. It is through link 40 that the system control 32 receives commands from the operator to indicate the san sequence that is to be performed. The pulse generator module 38 operates the system components to carry out the desired scan sequence and produce data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensor connected to the patient or subject, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan. In the embodiment depicted in FIG. 10, the operator console 12 may be located outside of the scan room. It may be noted that, in various embodiments, all or a portion of the control electronics or components may be located within the scan room. Thus, for example, all or a portion of the scan room interface 46 and/or backplane 32*a* may be eliminated and/or incorporated into other control electronics disposed within the scan room.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 and RF shield (not shown) form a part of a magnet assembly 52 which includes a polarizing magnet 54 and a RF coil assembly 56. A transceiver module 58 in the system control 32 produces pulses which are amplified by an RF amplifier 60 and coupled to the RF coil assembly 56 by a transmit/receive switch 62. The resulting signals emitted by the excited nuclei in the patient may be sensed by the same RF coil assembly 56 or apportion thereof and coupled through transmit/receive switch 62 to a preamplifier 64. The amplified MR signals are demodulated, filtered, and digitized in the receive section of the transceiver 58. The transmit/receive switch 62 is controlled by a signal from the pulse generator module 38 to electrically connect the RF amplifier 60 to the coil assembly 56 during the transmit mode and to connect the preamplifier 64 to the coil assembly 56 during the receive mode. The transmit/receive switch 62 can also enable a separate RF coil (for example, a surface coil) to be used in either the transmit or receive mode.

The MR signals picked up by the selected RF coil are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which may operate to Fourier transform the data into an array of image data. It may be noted that time variant and dependent Taylor series may be employed in various embodiments. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

As used herein, the term "computer" or "module" may include any processor-based or microprocessor-based system including systems using microcontrollers, reduced instruction set computers (RISC), ASICs, logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments. The set of instructions may be in the form of a software program. The software may be in various forms such as system software or application software and which may be embodied as a tangible and non-transitory computer readable medium. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein. Instead, the use of "configured to" as used herein denotes structural adaptations or characteristics, and denotes structural requirements of any structure, limitation, or element that is described as being "configured to" perform the task or operation.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f) unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal language of the claims.

What is claimed is:

1. A magnetic resonance imaging (MRI) gradient coil assembly comprising:
    a substrate having a surface;
    a first hollow conductor coil having a first coiled portion and a first end run portion joined by a first eye lead portion, wherein
    the first coiled portion defines a series of increasing radius loops disposed on the surface of the substrate, an outer loop of the first coiled portion defining a coiled portion boundary, the first eye lead portion disposed in a central portion of the first coiled portion, and
    the first end run portion extends continuously from the first coiled portion via the first eye lead portion beyond the coiled portion boundary; and
    a second hollow conductor coil disposed on the substrate in a side-by-side arrangement with the first hollow conductor coil along a length of the substrate, the second hollow conductor coil having a second coiled portion and a second end run portion continuously joined by a second eye lead portion, wherein the second end run portion is oriented parallel to the first end run portion and extends past the coiled portion boundary.

2. The gradient coil assembly of claim 1, wherein the first hollow conductor coil further comprises a first return run portion extending continuously from the outer loop of the first coiled portion.

3. The gradient coil assembly of claim 1, wherein at least a portion of the first end run is disposed above the surface of the substrate, wherein at least a portion of the first coiled portion is interposed between the at least a portion of the first end run portion and the surface of the substrate.

4. The gradient coil assembly of claim 1, wherein at least a portion of the first end run portion is disposed below the surface of the substrate, wherein at least a portion of the surface of the substrate is interposed between the at least a portion of the first end run portion and at least a portion of the first coiled portion.

5. The gradient coil assembly of claim 1, wherein the substrate defines a half-cylinder.

6. The gradient coil assembly of claim 1, wherein the second end run portion passes over the first hollow conductor coil before extending past the coiled portion boundary.

7. A magnetic resonance imaging (MRI) gradient coil system comprising:
    a substrate having a surface;
    a first hollow conductor coil having a first coiled portion, a first end run portion joined by a first eye lead portion, and a first return run portion extending continuously from the outer loop of the first coiled portion, wherein
    the first coiled portion defines a series of increasing radius loops disposed on the surface of the substrate, an outer loop of the first coiled portion defining a coiled portion boundary, the first eye lead portion disposed in a central portion of the first coiled portion,
    the first end run portion extends continuously from the first coiled portion via the first eye lead portion beyond the coiled portion boundary;
    a second hollow conductor coil disposed on the substrate in a side-by-side arrangement with the first hollow conductor coil along a length of the substrate, the second hollow conductor coil having a second coiled portion and a second end run portion continuously joined by a second eye lead portion, wherein the second end run portion is oriented parallel to the first end run portion and extends past the coiled portion boundary; and a manifold operably coupled to the first end run portion and the second end run portion, the manifold configured to provide electrical current and a fluid supply to the first hollow conductor coil via the first end run portion and to the second hollow conductor coil via the second end run portion.

8. The system of claim 7, wherein the second hollow conductor coil is provided with fluid independently from the first hollow conductor coil, and wherein the second end run portion passes over the first hollow conductor coil before extending past the coiled portion boundary.

9. The system of claim 8, wherein the first end run portion is configured to be supplied with a first current from the manifold passing in a first direction, and the second end run portion is configured to be supplied with a second current from the manifold passing in a second direction, wherein the first direction is opposite to the second direction.

10. The system of claim 7, wherein the substrate defines a half-cylinder, the system further comprising an additional substrate that cooperates with the substrate to define a cylinder, the system further comprising a third hollow conductor coil and a fourth hollow conductor coil disposed on the additional substrate.

11. The system of claim 7, wherein the first end run portion and second end run portion are coupled to separate electrical conduction members of the manifold, the electrically conducting members electrically insulated from each other.

12. The system of claim 7, wherein at least a portion of the first end run is disposed above the surface of the substrate, wherein at least a portion of the first coiled portion is interposed between the at least a portion of the first end run portion and the surface of the substrate.

13. The system of claim 7, wherein at least a portion of the first end run portion is disposed below the surface of the substrate, wherein at least a portion of the surface of the substrate is interposed between the at least a portion of the first end run portion and at least a portion of the first coiled portion.

14. The system of claim 7, further comprising a first transverse gradient coil assembly and a second transverse gradient coil assembly, wherein:
the first transverse gradient coil assembly comprises the substrate and the first hollow conductor coil assembly;
the second transverse gradient coil assembly comprises an additional substrate and an additional hollow conductor coil assembly;
the first transverse gradient coil assembly defines a first cylinder having a first diameter and the second transverse gradient coil assembly defines a second cylinder having a second diameter that is greater than the first diameter, wherein a gap is defined between the first transverse gradient coil assembly and the second transverse gradient coil assembly;
the first end run portion of the first transverse gradient coil assembly is disposed within the gap; and
an additional end run portion of the second transverse gradient coil assembly is disposed within the gap.

15. A method for forming a magnetic resonance imaging (MRI) gradient coil assembly, the method comprising:
winding a first hollow conductor coil to define a first coiled portion having a series of increasing radius loops;
disposing the first hollow conductor coil on a surface of a substrate, an outer loop of the first coiled portion defining a coiled portion boundary;
forming a first end run portion of the first hollow conductor coil that is continuously joined to the first coiled portion by a first eye lead portion, wherein the first end run portion extends continuously from the first coiled portion via the first eye lead portion beyond the coiled portion boundary;
winding a second hollow conductor coil to define a second coiled portion; and
disposing the second hollow conductor coil on the substrate in a side-by-side arrangement with the first hollow conductor coil along a length of the substrate, the second hollow conductor coil having a second end run portion joined to the second coiled portion by a second eye lead portion, wherein the second end run portion is oriented parallel to the first end run portion and extends past the coiled portion boundary.

16. The method of claim 15, further comprising bending the substrate to define a half-cylinder.

17. The method of claim 15, wherein forming the first end run portion comprises forming at least a portion of the first end run portion above the surface of the substrate, wherein at least a portion of the first coiled portion is interposed between the at least a portion of the first end run portion and the surface of the substrate.

18. The method of claim 15, wherein forming the first end run portion comprises forming at least a portion of the first end run portion below the surface of the substrate, wherein at least a portion of the surface of the substrate is interposed between the at least a portion of the first end run portion and at least a portion of the first coiled portion.

19. The method of claim 15, wherein the second end run portion passes over the first hollow conductor coil before extending past the coiled portion boundary.

20. The method of claim 19, wherein the second end run portion of the second hollow conductor coil is oriented parallel to the first end run portion of the first hollow conductor coil.

* * * * *